(12) United States Patent
Gumbrecht

(10) Patent No.: US 11,567,157 B2
(45) Date of Patent: Jan. 31, 2023

(54) CALIBRATION OF A MAGNETIC RESONANCE DEVICE AND ESTIMATING A SPECIFIC ABSORPTION RATE

(71) Applicant: Siemens Healthcare GmbH, Erlangen (DE)

(72) Inventor: Rene Gumbrecht, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/372,881

(22) Filed: Jul. 12, 2021

(65) Prior Publication Data
US 2022/0034987 A1   Feb. 3, 2022

(30) Foreign Application Priority Data

Jul. 30, 2020   (DE) ...................... 10 2020 209 629.5

(51) Int. Cl.
*G01V 3/00*   (2006.01)
*G01R 33/58*  (2006.01)
(Continued)

(52) U.S. Cl.
CPC ......... *G01R 33/583* (2013.01); *G01R 33/288* (2013.01); *G01R 33/3635* (2013.01); *G01R 33/5611* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| 2,478,317 A | * | 8/1949 | Purcell | .................... H01P 5/181 |
| | | | | 333/22 R |
| 2010/0244840 A1 | | 9/2010 | Mckinnon | |

(Continued)

FOREIGN PATENT DOCUMENTS

| CN | 101399464 A | * | 4/2009 | .............. H02J 5/005 |
| CN | 107004959 A | * | 8/2017 | ............. H01Q 1/243 |

(Continued)

OTHER PUBLICATIONS

German Office Action for German Application No. 10 2020 209 629.5 dated May 26, 2021.

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method is provided for calibration of a magnetic resonance device with a transmitting device for generating an excitation field. In a first acquisition phase, a first transmitting coil element is detuned, at least one second transmitting coil element is tuned, and an MR data set is acquired using the transmitting device. In a second acquisition phase, the first transmitting coil element, the at least one second transmitting coil element are tuned, and at least one further MR data set is acquired using the transmitting device. By an arithmetic unit, a calibration factor is determined based on the MR data set and the at least one further MR data set for calculating a total voltage value at a feeding point of the first transmitting coil element from voltage values, which may be measured at a measuring point of an electrical supply line of the first transmitting coil element.

16 Claims, 1 Drawing Sheet

(51) Int. Cl.
*G01R 33/28* (2006.01)
*G01R 33/36* (2006.01)
*G01R 33/561* (2006.01)

(58) Field of Classification Search
USPC .......................................................... 324/309
See application file for complete search history.

(56) References Cited

U.S. PATENT DOCUMENTS

2014/0306702 A1* 10/2014 Lazar ..................... G01R 33/34
324/318
2018/0156879 A1    6/2018 Findeklee

FOREIGN PATENT DOCUMENTS

| CN | 107615680 A | * | 1/2018 | ........... H04B 7/0413 |
| CN | 110087538 A | * | 8/2019 | ............. A61B 5/055 |
| DE | 112016001879 T5 | | 1/2018 | |
| EP | 2644092 A1 | * | 10/2013 | ............. A61B 5/055 |
| WO | WO-2006051614 A1 | * | 5/2006 | ............. H01Q 3/267 |

* cited by examiner

CALIBRATION OF A MAGNETIC RESONANCE DEVICE AND ESTIMATING A SPECIFIC ABSORPTION RATE

The present patent document claims the benefit of German Patent Application No. 10 2020 209 629.5, filed Jul. 30, 2020, which is hereby incorporated by reference in its entirety.

TECHNICAL FIELD

The present disclosure relates to a method for calibration of a magnetic resonance device with a transmitting device for generating an excitation field, which includes a first transmitting coil element and at least one second transmitting coil element, wherein the first transmitting coil element is coupled to the at least one second transmitting coil element. The disclosure also relates to a method for estimating a specific absorption rate for an object to be examined in the case of an examination with a magnetic resonance device, to a magnetic resonance device, and to a computer program product.

BACKGROUND

In the case of examination by magnetic resonance tomography, radio frequency electromagnetic radiation acts on the body of the person being examined. The tissue may accordingly heat up as a function of the respective specific absorption rate (SAR), in other words, the electromagnetic power absorbed per unit mass. It may be desirable, therefore to monitor the specific absorption rate in the case of examinations with magnetic resonance devices. In the case of magnetic resonance systems with parallel transmission, a plurality of transmitting coil elements is used for generating the radio frequency excitation field. Because the fields of the individual transmitting coil elements may possibly interfere in different ways depending on actuation, monitoring of the specific absorption rate is particularly desirable in this connection.

With known approaches for estimating the specific absorption rate, simulation models are used, on the basis of which the entire system, including the person to be examined and the different components of the magnetic resonance device, is simulated in order to estimate a local specific absorption rate in the relevant region from corresponding input variables. Feeding lines or feeding voltages are used as the input variables for this purpose, with which the individual transmitting coil elements are actively operated for generating the excitation field.

A consequence of this is that very complex simulation models have to be used, which, in particular, also have to map how specific electromagnetic fields are generated from the fed powers or voltages on the basis of the transmitting coil elements, how the electromagnetic fields of individual transmitting coil elements interact, etc. This may be disadvantageous because the relationship between electromagnetic field generated by a transmitting coil element and the fed voltage or power depends on the specific load situation of the transmitting coil element, (e.g., on how the specific transmitting coil element is coupled exactly to the remaining transmitting coil elements and which coupling results due to the person to be examined or other components of the MR system). The relationship ultimately therefore depends on which impendences are established in the transmitting coil elements and which fields are produced by the respective fed voltages.

The resulting high level of complexity of the simulation models to be used or the limited capacity of such models leads to increased computing effort for estimating the specific absorption rate or to increased inaccuracy of the estimated specific absorption rate. This may be accompanied by increased expenditure, for example, also in respect of the creation and validation of the simulation models.

SUMMARY AND DESCRIPTION

Against this background, it is an object to provide input variables for a simulation model for estimating a specific absorption rate during the examination by a magnetic resonance device, by way of which the accuracy of the estimation may be increased.

The scope of the present disclosure is defined solely by the appended claims and is not affected to any degree by the statements within this summary. The present embodiments may obviate one or more of the drawbacks or limitations in the related art.

The disclosure is based on the idea of determining or specifying a calibration factor, on the basis of which voltage values, which may be measured at a measuring point of a supply line of a transmitting coil element, may be converted into a total voltage value at a feeding point of the transmitting coil element. The total voltage value is proportional to a current flowing in the transmitting coil element, which, in turn, is proportional to an electromagnetic field, which is generated by the transmitting coil element.

A method is disclosed for calibration of a magnetic resonance device with a transmitting device, in particular a radio frequency transmitting device, for generating an excitation field. The transmitting device has a first transmitting coil element and a second transmitting coil element. The first transmitting coil element is coupled to the at least one second transmitting coil element, (e.g., inductively coupled and/or capacitively coupled). According to the method, (e.g., by a tuner of the magnetic resonance device), the first transmitting coil element is detuned for a first acquisition phase and the at least one second transmitting coil element is tuned for the first acquisition phase, (e.g., every second transmitting coil element of the at least one second transmitting coil element is tuned). During the first acquisition phase, an MR data set is acquired using the transmitting device. For a second acquisition phase, the first transmitting coil element and the at least one second transmitting coil element, (e.g., every second transmitting coil element), is tuned in particular by the tuner. During the second acquisition phase, at least one further MR data set is acquired using the transmitting device. By an arithmetic unit, a calibration factor is determined on the basis of the MR data set and the at least one further MR data set. The calibration factor may be determined for calculating a total voltage value at a feeding point of the first transmitting coil element from voltage values, which may be measured at a measuring point of an electrical supply line of the first transmitting coil element. Magnetic resonance will be abbreviated here and below to MR.

In other words, the calibration factor links the total voltage value at the feeding point to the voltage values which may be measured at the measuring point.

The magnetic resonance device may be configured as a magnetic resonance device for parallel transmission. Such devices are also referred to as Parallel-Transmit Systems or Multi-Transmit Systems. The transmitting coil elements may be operated independently of each other in order to thus generate a particularly flexible and accurate definition of the excitation fields generated by the transmitting device.

Magnetic resonance tomography or other methods for magnetic resonance-based examination are based on the concept of orienting nuclear spins of the object to be examined by a homogeneous basic magnetic field and on the basis of the excitation field, which includes an electromagnetic field which changes over time and in particular a magnetic field, therefore, to excite them to precession. Resonances of the precessing spins may then be detected by a detection device of the magnetic resonance device. The transmitting coil elements may also be part of the detection device, or the detection device may include separate coil elements.

As a rule, the excitation field is also referred to as a radio frequency field, in other words, HF field or RF field. The excitation field is generated, in particular, in the form of one or more successive radio frequency pulse(s), in other words, HF pulses or RF pulses.

The feeding point, (e.g., a feed port), of the first transmitting coil element may correspond to a port of the first transmitting coil element for connecting the electrical supply line, which, in turn, is connected to an RF generation system. The RF generation system may generate the RF pulses or excitation pulses or feed them via the supply line into the first transmitting coil element. The connection of the first transmitting coil element to the electrical supply line necessarily produces signal reflections, so some of the fed excitation pulses may be reflected. The consequence of this is that, in a specific situation, a forward running signal component and a backward running or reflecting signal component are present in the supply line. Forward running refers in this case to the direction of the RF generation system in the direction of the first transmitting coil element and backward running refers to the opposite direction. These two signal components overlap each other, so different phases may be produced between the forward running signal component and the backward running signal component at the feeding point and at the measuring point, which is spatially remote from the feeding point.

While the total voltage value at the feeding point, (in other words, the total of a forward voltage value of the forward running signal component and a backward voltage value of the backward running signal component at the feeding point), is proportional to the current flowing through the first transmitting coil element and accordingly to the electromagnetic field generated by the first transmitting coil element, this may not be true at the measuring point. The fundamental relationship between the total voltage value at the feeding point and the measured voltage values at the measuring point is known, however.

In particular, the total voltage value as given by the following relationship:

$$U = \alpha * U_{M,v} + (1/\alpha) * U_{M,r}$$

wherein U denotes the total voltage value, $\alpha$ denotes the calibration factor, $U_{M,v}$ denotes the voltage value of the forward running signal component at the measuring point, and $U_{M,r}$ denotes the voltage value of the backward running signal component at the measuring point.

The calibration factor, which is given, in particular, by a complex number, is constant irrespective of the load situation and in particular does not depend on the voltage values which may be measured at the measuring point. Once the calibration factor has been determined, therefore, the total voltage value may be calculated from the above relationship, even in differing situations, from the measured voltage values, and owing to the proportionality to the current through the first transmitting coil element may, in turn, be used as an input variable for a simulation model for estimating the specific absorption rate.

As a result, the load dependency of the relationship between fed power and generated electromagnetic field is removed to a certain extent from the simulation, therefore and replaced by the determination of the calibration factor. The dependency of properties of the transmitting coil elements, (e.g., their ohmic resistance), and the properties of the coupling between the transmitting coil elements no longer has to be mapped by the simulation model either. Because the calibration factor, as described, is based on MR data sets, and possibly measured voltage values, a more reliable input variable is provided thereby for the simulation model, so more accurate simulation results may be achieved and possibly with lower computing effort.

That the first transmitting coil element is coupled to the at least one second transmitting coil element may be taken to mean that the first transmitting coil element is coupled to one or to a plurality of second transmitting coil element(s) of the at least one second transmitting coil element. The coupling may be an inductive coupling. A varying electromagnetic field generated by a transmitting coil element induces a voltage in the respectively coupled transmitting coil element, and vice versa. Alternatively, or in addition, a capacitive coupling may also be provided.

For acquiring the MR data set or the further MR data sets using the transmitting device during the first or the second acquisition phase, (e.g., in each case), one or more excitation pulses are generated by the transmitting device, (e.g., by one or more of the transmitting coil elements), and applied to the object to be examined. By the detection device of the magnetic resonance device MR signals are detected in response to the excitation pulses according to the pulse sequence used and the MR data set or one of the further MR data sets is generated on the basis of the MR signals, in particular by the arithmetic unit. The transmitting device and the detection device may have some common components, so transmitting coil elements may also serve as receiving coil elements.

The detuning or tuning of a transmitting coil element may here and below be taken to mean resonant detuning or tuning, so, in other words, the respective resonance frequency of the corresponding transmitting coil element is detuned or tuned, in particular in respect of a frequency, (e.g., a carrier frequency), of the excitation field. Accordingly, in a detuned transmitting coil element, (in particular, the first transmitting coil element detuned during the first acquisition phase), no voltage is generated owing to coupled further second transmitting coil elements. The detuned transmitting coil element is decoupled to a certain extent from the remaining transmitting coil elements. A detuned transmitting coil element is not actively operated here and below either, in other words, no voltage or power is fed in. From this, in a converse argument, it cannot be concluded that a tuned transmitting coil element is necessarily being actively operated. Instead, owing to the coupling, induced voltages may likewise build up in a tuned transmitting coil element, which is not actively operated.

That a transmitting coil element is detuned may here and below be taken to mean that it is detuned if it was tuned before the detuning or remains detuned if it was already detuned. The same applies analogously to tuning of a transmitting coil element.

Throughout the entire first acquisition phase, the first transmitting coil element remains detuned and the at least one second transmitting coil element remains tuned. Accordingly, the first transmitting coil element and the at least one second transmitting coil element remain tuned throughout the entire second acquisition phase.

Accordingly, at least one second transmitting coil element is actively operated during the first acquisition phase in order to acquire the MR data set as described. During the second acquisition phase, the first transmitting coil element and/or one or more of the second transmitting coil elements is actively operated in order to acquire the at least one further MR data set. The second acquisition phase does not necessarily lie after the first acquisition phase time-wise.

According to at least one embodiment of the method for calibration of a magnetic resonance device, for acquiring of the MR data set, (e.g., during the first acquisition phase), every second transmitting coil element of the at least one second transmitting coil element is actively operated.

As explained above, the first transmitting coil element is not actively operated because it is detuned during the first acquisition phase. Because, in other words, an electromagnetic field is generated by the first transmitting coil element during the first transmitting coil element neither by active operating nor by coupling to the at least one second transmitting coil element, it is provided that the MR data set is completely unaffected by the first transmitting coil element or its properties.

The first MR data set may be regarded as a reference data set, therefore, with which the at least one further MR data set may be compared in order to quantify a respective amount, which is attributed to the first transmitting coil element.

According to at least one embodiment, the second acquisition phase includes an acquisition act associated with the first transmitting coil element. During the acquisition act associated with the first transmitting coil element, a further MR data set of the at least one further MR data set is acquired, with the first transmitting coil element being actively operated during the acquisition act associated with it and no second transmitting coil element of the at least one second transmitting coil element being actively operated.

Because both the first transmitting coil elements and the at least one second transmitting coil element are tuned during the second acquisition phase, the electromagnetic field generated during the acquisition act associated with the first transmitting coil element returns to the first transmitting coil element and, per coupling, at least one of the second transmitting coil elements.

According to at least one embodiment, for every second transmitting coil element of the at least one second transmitting coil element, the second acquisition phase includes an acquisition act associated with the respective second transmitting coil element. During the acquisition act associated with the respective second transmitting coil element, a respective further MR data set of the at least one further MR data set is acquired, wherein the respective second transmitting coil element is actively operated during the acquisition act associated with it, whereas no further second transmitting coil element of the at least one second transmitting coil element is actively operated and the first transmitting coil element is not actively operated either.

In other words, during each acquisition act of the second acquisition phase, exactly one transmitting coil element of the transmitting device is actively operated. Either the first transmitting coil element is actively operated or exactly one of the second transmitting coil elements. If the number of second transmitting coil elements is designated N−1, then N further MR data sets are generated in the second acquisition phase, with exactly one transmitting coil element being actively operated, namely the first transmitting coil element or exactly one of the second transmitting coil elements, for generation of each of the N further MR data sets.

Because the MR data set was acquired during the first acquisition phase without any contribution of the first transmitting coil element, any value of the MR data set may be expressed as a linear combination of corresponding values of the further MR data sets. A value may correspond to a value of a corresponding pixel or voxel in an MR image, a value for a particular point in the k-space, etc. The specific content of the MR data sets is not crucial for the disclosure. In particular, it is not necessary for the MR data sets or the further MR data sets to correspond to complete MR images. The MR data sets and the further MR data sets may correspond to parts of MR images or also parts of k-space data sets. It is merely necessary that the values of the MR data sets, and the further MR data sets may likewise change as a function of a change in the excitation field.

Using the illustrated linear relationship, the forward voltage value of the forward running signal component at the measuring point may be determined on the basis of the MR data set and the at least one further MR data set. In other words, corresponding forward voltage values may be determined, which would be necessary for generation of the MR data set from the first acquisition phase if all transmitting coil elements are resonantly tuned. This may occur by way of the solution to a corresponding linear equation system. The backward voltage value of the backward running signal component at the measuring point may be determined in that the first transmitting coil element is actively operated in accordance with the determined forward voltage value and the backward voltage value established at the measuring point is measured. Alternatively, the backward voltage value may be determined by the arithmetic unit on the basis of the determined forward voltage value and a specified scattering matrix. The scattering matrix describes the behavior of the fed excitation pulses at the transition of the connection service to the feeding point.

Because as a result of the decoupling of the first transmitting coil element during the first acquisition phase the current through the first transmitting coil element as well as the total voltage value at the feed point has to be equal to zero, and therewith no MR effective field is generated by the first transmitting coil element either, the calibration factor may be calculated from the relationship between total voltage value and voltage values measured or which may be measured at the measuring point.

Such embodiments have the advantage that a systematic determination of the calibration factor is permitted without the further MR data sets having to be compared explicitly with the MR data set in order to identify the decoupled state. In the same way, the corresponding calibration factors may also be determined for all second transmitting coil elements of the transmitting device.

According to at least one embodiment of the method, a second transmitting coil element of the at least one second transmitting coil element is actively operated for acquiring the MR data set during the first acquisition phase.

During the second acquisition phase, the first transmitting coil element is actively operated, wherein a feed-in power, and therewith an input terminal voltage, is iteratively changed until the MR data set is reproduced by a corresponding further MR data set of the at least one further MR data set.

If with a tuned first transmitting coil element the MR data set from the first acquisition phase is reproduced in the second acquisition phase, this provides that no electromagnetic field is generated by the first transmitting coil element. If this state has been established, the voltage values at the measuring point may be measured and, based thereon, the calibration factor may be calculated as described above.

According to at least one embodiment of the method, the voltage values, which may be measured at the measuring point, include the forward voltage value of the forward running signal component at the measuring point and the backward voltage value of the backward running signal component at the measuring point, or the voltage values which may be measured at the measuring point are given by the forward voltage value and the backward voltage value.

In particular, a directional coupler, which is connected at the measuring point to the electrical supply line or is integrated in the supply line, may be used for measuring the forward voltage value and the backward voltage value. Consequently, forward running signal component and backward running signal component may be considered and measured separately.

According to at least one embodiment, the total voltage value is given by the forward voltage value, the backward voltage value, and the calibration factor.

In particular, the total voltage value is equal to a sum of forward voltage value of a forward running signal component at the feeding point and a backward voltage value of a backward running signal component at the feeding point.

According to at least one embodiment, the forward voltage value is determined by the arithmetic unit on the basis of the MR data set and the at least one further MR data set.

This may occur by solving the linear equation system as described above or by a direct alignment or comparison of the MR data set with the respective further MR data set of the corresponding iteration if the above-described iterative method is used.

According to at least one embodiment, the backward voltage value is determined by the arithmetic unit on the basis of the determined forward voltage value and a specified scattering matrix.

The scattering matrix describes the behavior of a fed voltage pulse at the transition between supply line and feeding point. Such embodiments have the advantage that the backward voltage value thus does not necessarily have to be measured for every required case.

According to at least one embodiment, the first transmitting coil element is actively operated according to the determined forward voltage value and the backward voltage value is measured at the measuring point.

A method is also disclosed for estimating a specific absorption rate for an object to be examined in the case of an examination with a magnetic resonance device, which includes a transmitting device for generating an excitation field. The transmitting device has a first transmitting coil element and at least one second transmitting coil element, wherein the first transmitting coil element is coupled to the at least one second transmitting coil element, (e.g., inductively and/or capacitively coupled). According to the method for estimating the specific absorption rate, a method for calibration of a magnetic resonance device is carried out. By the transmitting device, an excitation pulse is applied to the object and during application of the excitation pulse the voltage values which may be measured at the measuring point are measured. By the arithmetic unit, the total voltage value is determined on the basis of the measured voltage values and the calibration factor. The determined total voltage value is used by the arithmetic unit as an input variable for a specified simulation model for estimating the specific absorption rate.

The voltage values are measured at the measuring point, in particular, by a directional coupler.

The arithmetic unit applies the simulation model as a function of the input variable in order to determine the specific absorption rate for the object or a local specific absorption rate for a section of the object.

A magnetic resonance device is also disclosed. The magnetic resonance device has a transmitting device, which includes a first transmitting coil element and at least one second transmitting coil element. The first transmitting coil element is coupled to the at least one second transmitting coil element, (e.g., inductively and/or capacitively coupled). The transmitting device is configured to apply an excitation pulse to an object to be examined. The magnetic resonance device has a measuring apparatus configured to measure, during the application of the excitation pulse, voltage values at a measuring point of an electrical supply line for the first transmitting coil element. The magnetic resonance device has an arithmetic unit, which is configured to determine a total voltage value at a feeding point of the first transmitting coil element on the basis of the measured voltage values and a specified calibration factor. The arithmetic unit is configured to use the total voltage value as an input variable for a specified simulation model in order to determine a specific absorption rate for the object.

The magnetic resonance device, (e.g., a directional coupler of the magnetic resonance device), is connected to the supply line or integrated in the supply line in order to measure the voltage values at the measuring point.

The calibration factor was determined, in particular, by a method for calibrating a magnetic resonance device and stored on a storage element of the magnetic resonance device, in particular of the arithmetic unit.

In particular, the magnetic resonance device is configured to carry out a method for calibrating the magnetic resonance device and to store the calibration factor determined thereby on the storage element.

According to at least one embodiment of the magnetic resonance device, the measuring apparatus has a tuner, which for a first acquisition phase is configured to detune the first transmitting coil element and to tune the at least one second transmitting coil element. The magnetic resonance device, (e.g., the transmitting device, a detection device of the magnetic resonance device, and the arithmetic unit), is configured to acquire an MR data set during the first acquisition phase. For a second acquisition phase, the tuner is configured to tune the first transmitting coil element and the at least one second transmitting coil element. The magnetic resonance device, (e.g., the transmitting device, the detection device, and the arithmetic unit), is configured to acquire at least one further MR data set during the second acquisition phase. On the basis of the MR data set and the at least one further MR data set, the arithmetic unit is configured to determine the calibration factor for calculating the total voltage value at the feeding point of the first transmitting coil element from voltage values, which may be measured at the measuring point.

According to at least one embodiment, the magnetic resonance device has a directional coupler arranged on the supply line in such a way as to separate a forward running signal component at the measuring point from a backward running signal component at the measuring point. The measuring apparatus includes a measuring device configured to measure a forward voltage value of the forward running signal component and to measure a backward voltage value of the backward running signal component in order to measure voltage values at the measuring point. In other words, the voltage values measured at the measuring point include the forward voltage value and the backward voltage value or are given thereby.

Further embodiments of the magnetic resonance device follow directly from the various embodiments of the method for calibrating a magnetic resonance device and from the various embodiments of the method for estimating a specific absorption rate and vice versa respectively. In particular, the magnetic resonance device may be configured or programmed to carry out a method for calibrating a magnetic resonance device and/or a method for estimating a specific absorption rate, or the magnetic resonance device carries out such a method.

A computer program with commands is also disclosed. On execution of the commands or of the computer program by a magnetic resonance device, in particular, by the arithmetic unit of the magnetic resonance device, the commands cause the magnetic resonance device to carry out a method for calibrating a magnetic resonance device or a method for estimating a specific absorption rate.

A computer readable storage medium is also disclosed, which stores a computer program disclosed herein.

Computer programs and computer readable storage media may be taken to mean computer program products in each case.

BRIEF DESCRIPTION OF THE DRAWINGS

The disclosure will be explained in more detail below with reference to specific exemplary embodiments and associated schematic drawings. In the drawings.

DETAILED DESCRIPTION

Figure 1:
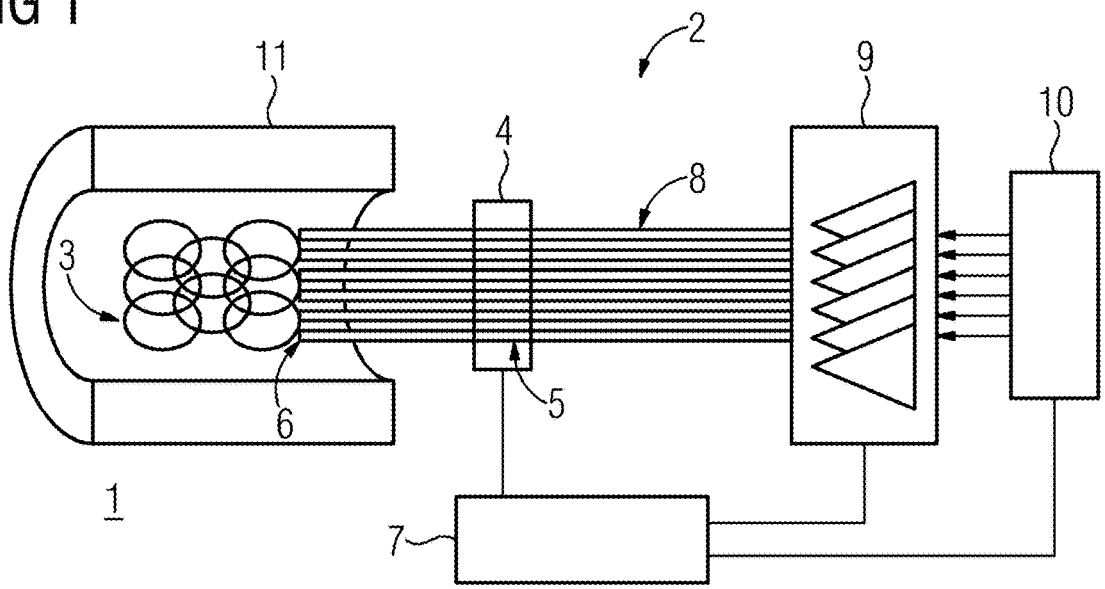
FIG. 1 depicts a schematic representation of an exemplary embodiment of a magnetic resonance device.

FIG. 1 schematically illustrates an exemplary embodiment of a magnetic resonance device 1. The magnetic resonance device 1 has a scanner tube 11, (also referred to as a scanner bore), and a basic field generation device (not shown) in order to generate a homogeneous basic magnetic field, (also referred to as B0), in the interior of the scanner tube 11. The magnetic resonance device 1 also has a transmitting device in order to generate radio frequency excitation pulses. The transmitting device includes a large number of transmitting coil elements 3 coupled (e.g., inductively coupled) to each other in such a way that every transmitting coil element 3 is coupled to at least one further one of the transmitting coil elements 3.

The magnetic resonance device 1 also has an RF supply system 2 in order to actively operate the transmitting coil elements 3 and consequently generate the corresponding excitation pulses. The RF supply system 2 includes a signal generator stage 10 and an amplifier stage 9. In addition, for every transmitting coil element 3 the RF supply system 2 includes a corresponding electrical supply line 8, (e.g., a coaxial cable), which connects a feeding point 6 of the respective transmitting coil element 3 to the amplifier stage 9. In particular, for each of the transmitting coil elements 3, the amplifier stage 9 may contain an amplifier unit connected via the respective supply line 8 to the corresponding transmitting coil element 3. In different embodiments, the signal generator stage 10 may likewise have a corresponding generator unit for each of the transmitting coil elements 3.

For generating the excitation pulses, the transmitting coil elements 3 may be actuated via the signal generator stage 10 and the amplifier stage 9 individually and independently of each other therefore, and thus be actively operated in that corresponding RF pulses are fed in via the corresponding electrical supply line 8.

The magnetic resonance device 1 also has a control system 7, which may be coupled to the amplifier stage 9 and the signal generator stage 10 in order to actuate them accordingly.

The magnetic resonance device 1 also has a detection device (not shown) in order to be able to detect MR signals generated by corresponding nuclear spin resonances in response to the applied RF pulses. The detection device may include one or more separate detection coil elements. Alternatively, or in addition, the transmitting coil elements 3 may also serve as detection coil elements. The control system 7 has, in particular, an arithmetic unit, which is coupled to the detection device in order to receive the MR signals.

In addition, the magnetic resonance device 1 has a measuring apparatus 4 arranged at respective measurement points 5 of the supply lines 8 in order to measure appropriate voltage values of a respective forward running signal component and of a respective backward running signal component in each of the supply lines 8. For this, the measuring apparatus 4 may have an appropriately arranged directional coupler for each of the supply lines 8. The measuring apparatus 4 and the directional coupler respectively are likewise connected to the control system 7, (e.g., to the arithmetic unit), so the arithmetic unit may include the measured voltage values of the forward running and backward running signal components.

The function of the magnetic resonance device 1 will be explained in more detail below with reference to exemplary embodiments of methods for calibrating a magnetic resonance device or methods for estimating a specific absorption rate, in particular, with reference to FIG. 2 and FIG. 3.

Hereinafter, the voltage value of the forward running signal component will be referred to as the forward voltage value and the voltage value of the backward running signal component will be referred to as the backward voltage value. In particular, the following assumptions form the basis of the described methods. It is assumed that at a defined reference plane of a transmitting coil element 3 the sum of forward voltage value and backward voltage value is in each case proportional to the current in the corresponding transmitting coil element 3. This applies at the respective feeding point 6 in particular. Furthermore, it is assumed that the current distribution within a transmitting coil element 3 is independent of the specific load distribution. The current in the transmitting coil element 3 is in turn proportional to the magnetic and electrical field, which is generated by this transmitting coil element 3 and the proportionality factor is likewise independent of the specific load situation. It is also assumed that the magnetic field generated by the transmitting coil elements 3, (also referred to as B1), or a portion of the magnetic field, (e.g., a positive circularly polarized portion, for example referred to as B1+), is proportional to the magnetic fields, which are generated by the transmitting coil elements 3 and the proportionality factor is likewise independent of the load situation. It is also assumed that a detuned transmitting coil element 3 does not generate an electromagnetic field.

Based on these assumptions, the sum of forward voltage value and backward voltage value of a given transmitting coil element 3 in a given but not necessarily known reference plane is, for example, proportional to the magnetic field portion B1+, which is generated by this transmitting coil element 3 and proportional to the corresponding electrical field. Without limiting the generality, it may be assumed that the proportionality factor is greater than zero.

Because the reference plane, at which the proportionality is given, is not necessarily known, one aim of a method for calibration is to find a complex calibration factor α, so:

$$U = \alpha * U_{M,v} + (1/\alpha) * U_{M,r} \sim B1 + \sim E$$

wherein U is referred to as the total voltage value, $U_{M,v}$ corresponds to the forward voltage value which may be measured at the measuring point 5, and $U_{M,r}$ the backward voltage value which may be measured at the measuring point 5.

If the calibration factor α is known, then the total voltage value for each measured combination of $U_{M,v}$ and $U_{M,r}$ may be calculated. Because the total voltage value is then proportional to the magnetic field B1+ or the electrical field, the total voltage value U may be used for simulation of the specific absorption rate of an object, which is examined with the magnetic resonance device 1.

In order to determine the value of α, a situation is reproduced, for example, in which for a given transmitting coil element 3 the generated field is equal to zero, where $U_{M,v}$ is not zero, so:

$$\alpha * U_{M,v} + (1/\alpha) * U_{M,r} = 0, \text{ and}$$

$$\alpha = (-U_{M,r}/U_{M,v})^{1/2}.$$

In other words, a situation is reconstructed in which the fields generated by the transmitting coil element being considered disappear.

Figure 2:
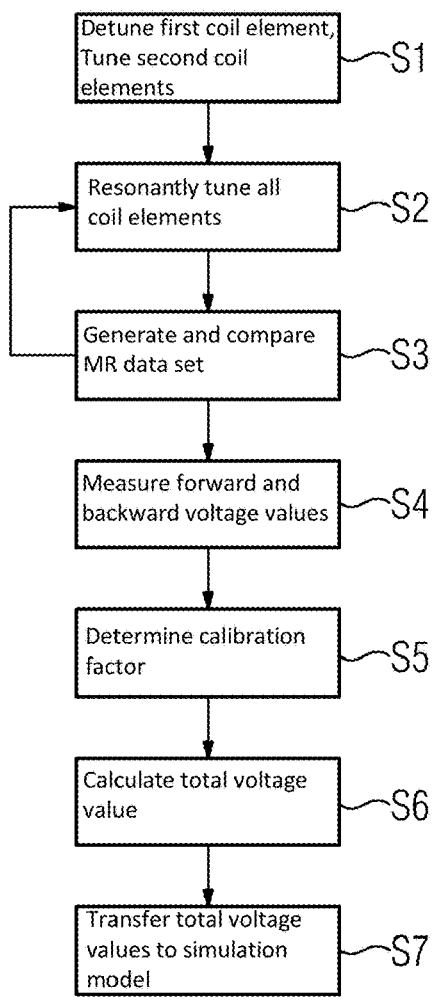
FIG. 2 depicts a flowchart of an exemplary embodiment of a method.

FIG. 2 illustrates a flowchart of an exemplary embodiment of a method for estimating a specific absorption rate, wherein the method includes an exemplary embodiment of a method for calibration of the magnetic resonance device 1 that is represented by the method acts S1 to S5.

The method will be described hereinafter for a specific transmitting coil element 3. The method may be carried out analogously for all remaining transmitting coil elements 3. The transmitting coil element 3 being considered is also referred to as the first transmitting coil element and the remaining transmitting coil elements 3 are also referred to as second transmitting coil elements.

In act S1, the first transmitting coil element 3 is detuned and the second transmitting coil elements 3 are each resonantly tuned by the tuner of the magnetic resonance device 1. In this state, an MR data set is acquired, with at least one of the second transmitting coil elements 3 being actively operated. The MR data set does not then include any signals, which were generated by the first transmitting coil element 3, because it was detuned.

In act S2, all transmitting coil elements 3, in other words, the first transmitting coil element 3 and the second transmitting coil elements 3, are now resonantly tuned and the measurement described in respect of S1 is repeated several times. Because all transmitting coil elements 3 are now resonantly tuned, the first transmitting coil element 3 generates in this situation a field even if it is not being actively operated because it is coupled to at least one of the second transmitting coil elements 3. A corresponding further MR data set is generated in every iteration and compared with the MR data set from act S1 in act S3. If these tolerances specified in context do not match, the forward voltage value of the first transmitting coil element 3 is adjusted and act S2 is repeated. These iterative acts are carried out until the MR data set from act S1 is reproduced. If this is the case, the first transmitting coil element 3 does not generate a field even though the forward voltage value is not zero. The first transmitting coil element 3 was put into a completely decoupled state, therefore.

In this situation, in act S4, the forward voltage value and the backward voltage value are then measured, (e.g., at the measuring point 5), by the measuring apparatus 4. In act S5, the calibration factor α may be determined according to the above equation on the basis of the measured voltage values.

In the same way, the corresponding calibration factors may be determined for all further transmitting coil elements 3.

If the object is now examined using the magnetic resonance device 1, the respective forward voltage values and the respective backward voltage values may be measured in act S6 at the measuring point 5 by the measuring apparatus 4 for each of the transmitting coil elements 3 during the application of a corresponding excitation pulse and, because the calibration factors α are known, the respective total voltage value may be calculated thereby.

In act S7, the total voltage values are then transferred by the arithmetic unit to a specified simulation model as input variables, which, on the basis thereof, calculate a local specific absorption rate in a target region of the object. Known simulation models may be used for this. Commercial software products, for example, are known for the electromagnetic simulations, with which the specific absorption rate may be simulated once for each transmitting coil element. The simulation model as such is not a subject matter of the present disclosure. The present disclosure is aimed rather at providing optimally suitable input variables in order to improve the estimation of the specific absorption rate in this way.

Figure 3:
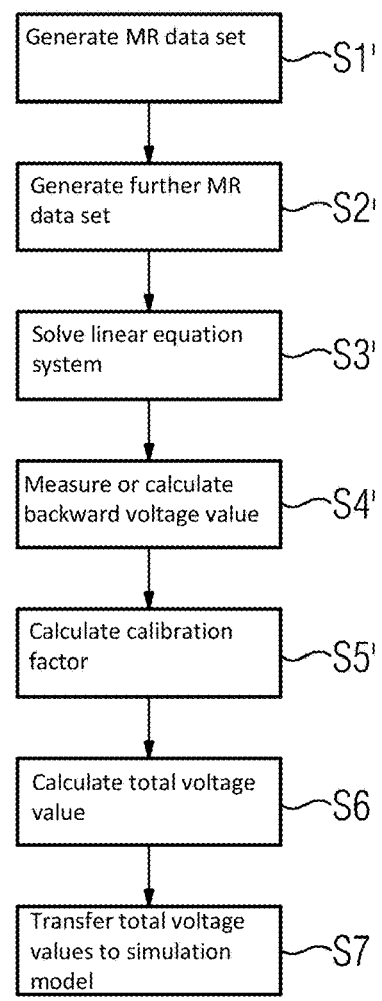
FIG. 3 depicts a flowchart of a further exemplary embodiment of a method.

FIG. 3 illustrates a flowchart of a further exemplary embodiment of a method for estimating a specific absorption rate, wherein here too acts S1 to S5' correspond to an embodiment of a method for calibrating the magnetic resonance device 1.

In act S1', an appropriate MR data set is generated for each transmitting coil element 3, wherein for each of the MR data sets generated in this way exactly one transmitting coil element 3 is detuned and all other transmitting coil elements 3 are resonantly tuned and actively operated.

In act S2', a further MR data set is in turn generated for each transmitting coil element 3, wherein this time in each case all transmitting coil elements 3 are resonantly tuned, but for each of the further MR data sets only exactly one of the transmitting coil elements 3 is actively operated. In alternative embodiments, the same information may be obtained in that linearly independent actuations are incorporated and then calculated back to the individual channel actuation.

In order to determine the calibration factor α for one of the transmitting coil elements 3, the following linear equation system is accordingly solved in act S3' by the arithmetic unit:

$$D1 = M*V.$$

In this case D1 corresponds to a vector, which includes, for example, the MR signal intensities for each voxel being considered of the MR data set from act S1', on the generation of which the considered transmitting coil element 3 was detuned. M corresponds to a matrix whose columns include, for example, vectors with MR signal intensities for each voxel being considered of the MR data sets from act S2'. V corresponds to the unknown vector being sought. The entries of the vector V are given per construction by the respective forward voltage values of the individual transmitting coil elements 3.

Once the linear equation system has been solved, the backward voltage value for the transmitting coil element 3 being considered may also be measured in act S4' or be calculated on the basis of a scattering matrix so the respective calibration factor α may be calculated in act S5' as described above. In the same way, this may take place for all remaining transmitting coil elements 3.

Acts S6 and S7 correspond to those which were described in respect of FIG. 3.

The method may be simplified further in different embodiments. For example, it is not necessary for each MR data set to generate a complete MR image. It may be sufficient to determine enough data to be able to solve the linear equation system. This may already be possible with a few lines in the k-space or, for example, on the basis of an individual FID. In addition, the possibilities for spatial encoding of the detection device may likewise be used to obtain further information about the field distribution.

In addition, it is not imperative to constantly measure the forward voltage value and the backward voltage value because the forward voltage value may optionally be predicted from the known system properties. The backward voltage value may optionally be determined from the forward voltage value on the basis of a previously determined scattering matrix.

The MR data sets may have many different forms. The MR data sets may be detected, for example, on the basis of gradient spin echo (GSE) methods or echoplanar (EPI) methods, or they may be B1 maps. All data dependent on MR signals may be used, which has a significant dependency on the applied excitation fields.

As described in particular with regard to the figures, the disclosure provides a possibility for generating input variables for simulation models for estimating the specific absorption rate, which enable more accurate estimation. In different embodiments, the measurements are directly adjusted at the directional coupler for this purpose, so assumptions about the transmitting coil elements or comparison measurements may be omitted. As the fields are measured more or less directly, the uncertainties associated therewith may be avoided.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for calibration of a magnetic resonance device with a radio frequency transmitting device for generating an excitation field, which comprises a first transmitting coil element and at least one second transmitting coil element, wherein the first transmitting coil element is coupled to the at least one second transmitting coil element, the method comprising:
 detuning the first transmitting coil element and tuning the at least one second transmitting coil element for a first acquisition phase;
 acquiring, during the first acquisition phase, a magnetic resonance (MR) data set using the radio frequency transmitting device;
 tuning the first transmitting coil element and the at least one second transmitting coil element for a second acquisition phase;
 acquiring, during the second acquisition phase, at least one further MR data set using the radio frequency transmitting device;
 determining, by an arithmetic unit based on the MR data set and the at least one further MR data set, a calibration factor;
 storing the determined calibration factor on the magnetic resonance device; and
 calculating, using the determined calibration factor, a total voltage value at a feeding point of the first transmitting coil element from voltage values, which is configured to be measured at a measuring point of an electrical supply line of the first transmitting coil element.

2. A method for estimating a specific absorption rate for an object to be examined in case of an examination with a magnetic resonance device with a radio frequency transmitting device for generating an excitation field, which comprises a first transmitting coil element and at least one second transmitting coil element, wherein the first transmitting coil element is coupled to the at least one second transmitting coil element, the method comprising:
 detuning the first transmitting coil element and tuning the at least one second transmitting coil element for a first acquisition phase;
 acquiring, during the first acquisition phase, a magnetic resonance (MR) data set using the radio frequency transmitting device;
 tuning the first transmitting coil element and the at least one second transmitting coil element for a second acquisition phase;
 acquiring, during the second acquisition phase, at least one further MR data set using the radio frequency transmitting device;
 determining, by an arithmetic unit based on the MR data set and the at least one further MR data set, a calibration factor for calculating a total voltage value at a feeding point of the first transmitting coil element from voltage values;
 applying an excitation pulse to the object by the radio frequency transmitting device;
 examining the object using the applied excitation pulse;
 measuring the voltage values at the measuring point during the applying of the excitation pulse;
 determining the total voltage value by the arithmetic unit based on the measured voltage values and the calibration factor; and
 estimating a specific absorption rate for the examining of the object, by a specified simulation model, using the determined total voltage value as an input variable for the specified simulation model.

3. A magnetic resonance device comprising:
 a radio frequency transmitting device having a first transmitting coil element and at least one second transmitting coil element, wherein the first transmitting coil element is coupled to the at least one second transmitting coil element, and wherein the radio frequency transmitting device is configured to apply an excitation pulse to an object to be examined;

a measuring apparatus configured to measure, during the application of the excitation pulse, voltage values at a measuring point of an electrical supply line for the first transmitting coil element; and an arithmetic unit configured to determine a total voltage value at a feeding point of the first transmitting coil element based on the measured voltage values and a specified calibration factor, wherein the magnetic resonance device is configured to examine the object using the applied excitation pulse, and wherein the arithmetic unit is configured to use the total voltage value as an input variable for a specified simulation model in order to determine a specific absorption rate for the examination of the object.

4. The method of claim 1, wherein, for acquiring the MR data set, each of the at least one second transmitting coil element is actively operated.

5. The method of claim 4, wherein the second acquisition phase comprises an acquisition act associated with the first transmitting coil element,
wherein, during the acquisition act associated with the first transmitting coil element, a further MR data set of the at least one further MR data set is acquired, and
wherein the first transmitting coil element is actively operated and none of the at least one second transmitting coil element is actively operated during the acquisition act.

6. The method of claim 5, wherein the second acquisition phase for each of the at least one second transmitting coil element comprises an acquisition act associated with the respective second transmitting coil element,
wherein, during the acquisition act associated with the respective second transmitting coil element, a respective further MR data set of the at least one further MR data set is acquired, and
wherein the respective second transmitting coil element is actively operated and no further one of the at least one second transmitting coil element is actively operated, and the first transmitting coil element is not actively operated during the acquisition act associated with the respective second transmitting coil element.

7. The method of claim 1, wherein, for acquiring the MR data set, one of the at least one second transmitting coil element is actively operated.

8. The method of claim 7, wherein, during the second acquisition phase, the first transmitting coil element is actively operated, and a feeding power is iteratively changed until the MR data set is reproduced by a further MR data set of the at least one further MR data set.

9. The method of claim 1, wherein the voltage values, where are configured to be measured at the measuring point, comprise a forward voltage value of a forward running signal component at the measuring point and a backward voltage value of a backward running signal component at the measuring point.

10. The method of claim 9, wherein the total voltage value is given by the forward voltage value, the backward voltage value, and the calibration factor.

11. The method of claim 10, wherein the forward voltage value is determined by the arithmetic unit based on the MR data set and the at least one further MR data set.

12. The method of claim 11, wherein the backward voltage value is determined by the arithmetic unit based on the determined forward voltage value and a specified scattering matrix, or
wherein, for determining the backward voltage value, the first transmitting coil element is actively operated in accordance with the determined forward voltage value and the backward voltage value is measured at the measuring point.

13. The method of claim 9, wherein the total voltage value is given by:

$$U \sim \alpha * U_{M,v} + (1/\alpha) * U_{M,r},$$

wherein:
U denotes the total voltage value,
α denotes the calibration factor,
$U_{M,v}$ denotes the voltage value of the forward running signal component at the measuring point, and
$U_{M,r}$ denotes the voltage value of the backward running signal component at the measuring point.

14. The method of claim 9, wherein the forward voltage value is determined by the arithmetic unit based on the MR data set and the at least one further MR data set.

15. The method of claim 14, wherein the backward voltage value is determined by the arithmetic unit based on the determined forward voltage value and a specified scattering matrix, or
wherein, for determining the backward voltage value, the first transmitting coil element is actively operated in accordance with the determined forward voltage value and the backward voltage value is measured at the measuring point.

16. The magnetic resonance device of claim 3, wherein the measuring apparatus comprises a directional coupler arranged on the electrical supply line in such a way as to separate a forward running signal component at the measuring point from a backward running signal component at the measuring point, and
wherein the measuring apparatus further comprises a measuring device configured to measure a forward voltage value of the forward running signal component and a backward voltage value of the backward running signal component in order to measure the voltage values at the measuring point.

* * * * *